(12) United States Patent
Chakor

(10) Patent No.: US 6,639,229 B2
(45) Date of Patent: Oct. 28, 2003

(54) ALUMINUM IMPLANTATION METHOD

(75) Inventor: Hamou Chakor, Semblancay (FR)

(73) Assignee: STMicroelectronics, S.A., Gentilly (FR)

( * ) Notice: Subject to any disclaimer, the term of this patent is extended or adjusted under 35 U.S.C. 154(b) by 214 days.

(21) Appl. No.: 09/745,174

(22) Filed: Dec. 20, 2000

(65) Prior Publication Data

US 2002/0043630 A1 Apr. 18, 2002

(30) Foreign Application Priority Data

Dec. 22, 1999 (FR) ............................. 99 16288

(51) Int. Cl.⁷ ...................... H01J 37/317; H01L 21/265
(52) U.S. Cl. .............................. 250/492.21; 250/492.2; 250/423 R; 250/424; 250/425; 315/111.21; 313/231.31; 438/514; 438/535
(58) Field of Search ................ 250/492.21, 423 R, 250/424, 425, 492.2; 315/111.21; 313/231.31; 148/523, 900; 438/514, 535

(56) References Cited

U.S. PATENT DOCUMENTS

| | | | | |
|---|---|---|---|---|
| 4,451,303 A | * | 5/1984 | Hiraki et al. | 438/535 |
| 4,947,218 A | * | 8/1990 | Edmond et al. | 257/630 |
| 5,497,005 A | | 3/1996 | Medulla et al. | 250/423 R |
| 5,943,594 A | | 8/1999 | Bailey et al. | 438/514 |

OTHER PUBLICATIONS

French Search Report from French Patent Application 99 16288, filed Dec. 22, 1999.

* cited by examiner

Primary Examiner—Nikita Wells
(74) Attorney, Agent, or Firm—Wolf, Greenfield & Sacks, P.C.

(57) ABSTRACT

A method of aluminum ion generation for an implantation in a semiconductor wafer, including using nitrogen trifluoride as a gas for ionizing a solid alumina element.

12 Claims, No Drawings

ALUMINUM IMPLANTATION METHOD

BACKGROUND OF THE INVENTION

1. Field of the Invention

The present invention generally relates to the manufacturing of integrated circuits. More specifically, the present invention relates to the implantation of aluminum in semiconductor substrates generally used in the microelectronics industry. Such an implantation is performed in a substrate typically made of silicon. Aluminum is then used, instead of boron, to achieve a P-type doping. An advantage of aluminum is that it diffuses approximately seven times faster than boron. The aluminum is extracted from a solid alumina element (Al2O3), attached in an arc plasma ionization chamber. The aluminum that is desired to be implanted is in ionic form, a precursor gas being injected in the ionization chamber to release ions from the alumina pellet.

2. Discussion of the Related Art

An example of an aluminum implantation device of the type to which the present invention relates is described in U.S. Pat. No. 5,497,005, which is incorporated herein by reference. The aluminum implantation may be performed without a post-acceleration, as is the case in the above-mentioned document, or with a post-acceleration of the generated ions. In one case as in the other, a same ionic plasma source may be used. For example, such a plasma generator is based on a ionization chamber in which a precursor gas is injected. A filament conducting a current (generally between 0 and 200 mA) and biased with a potential difference with respect to the chamber walls releases electrons, which ionizes the gas present in the chamber. This gas is then used to etch an alumina pellet housed in the chamber, to release aluminum ions into the plasma. The chamber is provided with an opening generally of small dimension so that particles can be extracted therefrom. In a post-acceleration system, these ionized particles are accelerated by an electric field to reach the substrate on which the aluminum is to be implanted. In fact, these particles are extracted from the ionization chamber by the extraction energy (generally between 0 and 80 kV), then accelerated by the post-acceleration energy (generally between 0 and 80 kV).

In an implantor, not only the energy level of the ionization chamber, that is, the current in the filament of this chamber and the arc current, is set, but also the magnetic fields enabling the deviations of some ions to select, essentially by their atomic mass, the ions that are desired to be present in the plasma used for the implantation. Accordingly, among the steps of setting an ionization source of an implantor, reference will be made to the intensity of a given ion in the plasma. For the same extraction energy, the respective concentrations of the different ions in the plasma are different from one another and, when the extraction energy varies, the respective concentrations of the different ions vary in the same proportions with respect to one another.

The selection of the implanted ion is essentially performed by magnetic means of deviation of the ion beam at the ionization chamber exit. The ion is thus selected by its atomic mass in a curved tunnel, the ions of different masses being more or less deviated than the selected ion, then trapped by cryogenic pumps or stopped by walls.

The structure and operation of implantation systems are well known and will not be detailed any further.

To implant aluminum, above-incorporated by reference U.S. Pat. No. 5,497,005 provides using, as a precursor ionizing gas, silicon tetrafluoride ($SiF_4$). This fluorided gas can easily be ionized to generate ions $Si^+$, $Si^{++}$, $Si^{F+}$, $SiF_2^+$, and $SiF_3^+$. The plasma obtained by ionization can then etch the aluminum oxide or alumina ($Al_2O_3$) to generate ions $Al^+$, $Al^{++}$, and $Al^{+++}$, that join the plasma to be subsequently implanted in the semiconductor wafer. Among these ions, that which is selected by the setting of the implantor is aluminum (I) ion $Al^+$, which is extracted most from the pellet.

A disadvantage of the use of silicon tetrafluoride as the ionization precursor gas is that, among the obtained silicon ions, silicon (I) ion $Si^+$ has an atomic mass of 28, which is close to that of aluminum (I) ion $Al^+$, the atomic mass of which is 27.

When the atomic masses of the ions are close, the neighboring peaks of these two ions overlap in an implantation current/atomic mass characteristic. The higher the extraction energy, the wider the peaks at their base and the more they overlap. Due to the overlapping phenomenon of neighboring peaks, the two ions are often implanted instead of a single one. This is especially the case for silicon and aluminum by using silicon fluoride as a precursor gas. Further, in this example, the peak of the silicon (I) ion is much larger than that of the aluminum (I) ion so that, to avoid silicon ion currents that are too high, it is necessary to limit the current of aluminum ions, which adversely affects the implantation. This is particularly true for high-energy implantors, that is, implantors using a post-acceleration phenomenon.

Implantors can be divided into two large families according to whether the setting (adjusting) of the implantor on the compound that is desired to be implanted is performed manually or automatically. For manual machines, the setting may enable dissociating two relatively close peaks (for example, the peaks of ions $Si^+$ and of ion $Al^+$) to implant a single compound. However, such a dissociation is only possible for currents of small magnitude. As a result, to obtain a relatively high given dose, typically $1.10^{16}$ atoms/$cm^2$, it is necessary to submit the substrate to prolonged implantations. This is disadvantageous in terms of productivity. For automatic adjustment machines, the resolution, which is defined as the atomic mass at the top of the peak divided by the mass differential at mid-height, does not allow avoiding the implantation of the undesired compound. In particular, if an arc occurs in the ionization chamber, the automatic setting results in selecting the compound corresponding to the highest intensity peak. In the considered example, this leads to selecting the silicon (I) ion instead of aluminum.

It should further be noted that the implanted aluminum dose, which depends on the intensity of the beam as well as on the electric fields applied in extraction and post-acceleration is of particularly delicate setting when in presence of two ions of relatively close atomic mass.

SUMMARY OF THE INVENTION

The present invention aims at providing a novel method of aluminum ion generation, in particular for an implantation in a semiconductor wafer, which overcomes the disadvantages of conventional methods.

The present invention more specifically aims at providing a method that frees itself of the problems of atomic mass proximity between aluminum and silicon.

The present invention also aims at providing a solution that is valid whether the implantor is associated or not with a post-acceleration of the generated ions.

The present invention further aims at providing a solution that is valid for both implantors with a manual setting and an automatic setting of the magnetic fields and of the extraction energy.

To achieve these and other objects, the present invention provides a method of aluminum ion generation for an implantation in a semiconductor wafer, including of using nitrogen trifluoride ($NF_3$) as a gas for ionizing a solid alumina element ($Al_2O_3$).

According to an embodiment of the present invention, the obtained aluminum plasma is submitted to a post-acceleration.

According to an embodiment of the present invention, the extraction energy of the aluminum ions depends on the intensity of nitrogen monofluoride ions ($NF^+$) in the plasma.

DETAILED DESCRIPTION

The present invention provides using nitrogen trifluoride ($NF_3$) as an ionization precursor gas, to generate aluminum ions from an alumina pellet.

To solve the problems due to the use of silicon fluoride, it could have been devised to etch the alumina pellet with phosphorus trifluoride ($PF_3$), which is an ionization gas currently used to implant phosphorus in silicon to perform N-type dopings. Phosphorus trifluoride indeed seems to solve the problem of atomic mass proximity. The generated phosphorus ion ($P^+$) has an atomic mass of 31, that is, sufficiently distant from the peak of ion aluminum (I), the atomic mass of which is 27. However, the current ratio between the two species is, for a given extraction energy, in favor of phosphorus in a proportion ranging between 2 and 4 according to the used implantor. A problem that is then posed is that phosphorus deteriorates certain components of the implantor, especially in case of a post-acceleration. Indeed, the deviations by magnetic field imposed to the plasma have the object of trapping some species according to their sensitivity to the deviation with respect to the ion desired to be implanted. When phosphorus atoms hit certain implantor components, especially made of Teflon, which are particularly fragile, these components are quite rapidly pierced. It would accordingly be necessary to limit the phosphorus current to improve the implantor lifetime. However, in this case, the time of implantation of a given aluminum dose, and thus the manufacturing duration, increases accordingly due to the current ratio between the two species and the benefit of using aluminum instead of boron is lost.

Nitrogen trifluoride generates a nitrogen monofluoride ion ($NF^+$), the atomic mass of which is 33. This ion is thus already more distant from the aluminum (I) ion than ion $P^+$.

Further, the present inventor has determined that this ion has no destructive effect upon the implantor. Indeed, the current ratio between the aluminum (I) ion and the nitrogen monofluoride ion ($NF^+$) is inverted with respect to the use of boron trifluoride. The intensity of the aluminum ion in the beam substantially corresponds to double that of ion $NF^+$ resulting from the use of nitrogen trifluoride. Accordingly, this method can be used even in a post-acceleration system without adversely affecting the installation, since nitrogen monofluoride ions here have no destructive effect upon the machine. Further, the other parasitic ions ($NF^+$, $N^+$, $N_2^+$, $F^+$, $O^+$, $Mo^{++}$, etc.) present in smaller numbers also have no prejudicial effect.

It should also be noted that the current of the obtained aluminum ion can thereby be compatible with an industrial production with an implantation duration substantially corresponding to conventional durations.

The choice of nitrogen trifluoride is, for the present inventor, the more appropriate solution to the problems that the present invention aims at solving. In particular, nitrogen trifluoride has many advantages with respect to the other fluorided compounds that could have been considered.

For example, the use of sulfur hexafluoride ($SF_6$) would pose problems of high intensity peaks at levels of atomic mass 32 ($S^+$) similar to what would be encountered with ion $P^+$ for phosphorus trifluoride ($PF_3$). Further, an ion $SF^{++}$ having an atomic mass of 25.5 would also be found. The same selectivity problems as with ion $Si^+$ upon use of silicon tetrafluoride ($SiF_4$) would then have to be faced.

The use of arsenic trifluoride ($AsF_3$) would generate a high toxicity for man as well as problems of lifetime of the alumina pellet present in the implantor due to the high atomic mass (75) of ion $As^+$.

The use of tungsten hexafluoride ($WF_6$) would substantially pose the same problems as that of arsenic trifluoride with an additional instability problem due to its high mass.

Thus, the solution provided by the present invention of using nitrogen trifluoride as a precursor gas for the ionization of an alumina pellet can advantageously be used when aluminum is desired to be implanted in a semiconductor substrate, for example, to perform a P-type doping.

Of course, the practical implementation of the method of generation of aluminum (I) ions according to the present invention is within the abilities of those skilled in the art based on the functional indications given hereabove. In particular, they will be able to adapt the precursor gas flows as well as the extraction energies according to the type of installation used (with or without post-acceleration) and to the aluminum doses desired to be implanted.

As a specific example of implementation, a post-acceleration implantor known under trade mark HV-GSD-200E or 200 E2 or NV10-160 of Eaton Company and an ionization source of Bernas type of category IAS (Integral Arc Slit) or ELS (Extended Life Source) such as described for example in above-incorporated by reference U.S. Pat. No. 5,497,005 are used. A current of aluminum (I) ion $Al^+$ of approximately 2.5 mA that is compatible with an industrial production can then be obtained. For example, a dose of $6.10^{14}$ atoms/$cm^2$ is implanted in approximately 3.5 minutes. In this example, the current of nitrogen monofluoride ion $NF^+$ is then limited to approximately 0.95 mA.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for generating aluminum ions for an implantation in a semiconductor wafer, including using nitrogen trifluoride as a gas that interacts with a solid alumina element in order to produce aluminum ions.

2. The method of claim 1, wherein the obtained aluminum plasma is submitted to a post-acceleration or the generated ions.

3. The method of claim 1, wherein the extraction energy of the aluminum ions depends on the intensity of nitrogen monofluoride ions in the plasma.

4. The method of claim 2, wherein the extraction energy of the aluminum ions depends on the intensity of nitrogen monofluoride ions in the plasma.

5. In an ion implantation system having an ionization chamber, a source of aluminum ions, and an ionizing precursor gas, a method comprising acts of:
   producing a first concentration of at least one precursor ion from the precursor gas; and
   producing a second concentration of at least one aluminum ion by ionizing the source of aluminum ions with the first concentration of the at least one precursor ion,
   wherein an equivalent weight of the at least one aluminum ion and an equivalent weight of the at least one precursor ion differ by at least 2, and at a given extraction energy an aluminum ion current resulting from the second concentration is greater than a precursor ion current resulting from the first concentration.

6. The method according to claim 5 wherein the ionizing precursor gas is nitrogen trifluoride.

7. The method according to claim 5 wherein the source of aluminum ions is solid alumina.

8. An apparatus for implanting aluminum ions, the apparatus comprising:
   an ionization chamber;
   a source of aluminum ions; and
   an ionizing precursor gas,
   wherein the ionization chamber is capable of producing a first concentration of at least one precursor ion from the precursor gas and a second concentration of at least one aluminum ion by ionizing the source of aluminum ions with the first concentration of the at least one precursor ion, such that an equivalent weight of the at least one aluminum ion and an equivalent weight of the at least one precursor ion differ by at least 2, and at a given extraction energy an aluminum ion current resulting from the second concentration is greater than a precursor ion current resulting from the first concentration.

9. The apparatus according to claim 8 wherein the precursor gas is nitrogen trifluoride.

10. The apparatus according to claim 8 wherein the source of aluminum ions is solid alumina.

11. The apparatus according to claim 8, further comprising an analyzer magnet to facilitate separation of the first concentration of the at least one aluminum ion from the second concentration of the at least one precursor ion and a post-acceleration stage adapted to accelerate separated aluminum ions.

12. A method of generating aluminum ions in an ionization chamber comprising an act of:
   using nitrogen trifluoride as a gas for ionizing a solid alumina element to produce the aluminum ions.

* * * * *

UNITED STATES PATENT AND TRADEMARK OFFICE
CERTIFICATE OF CORRECTION

PATENT NO. : 6,639,229 B2 Page 1 of 1
APPLICATION NO. : 09/745174
DATED : October 28, 2003
INVENTOR(S) : Hamou Chakor It is certified that error appears in the above-identified patent and that said Letters Patent is hereby corrected as shown below:

Column 4, claim 2, lines 59-61 should read:

2. The method of claim 1, wherein the obtained aluminum plasma is submitted to a post-acceleration of the generated ions .

Signed and Sealed this

Twenty-second Day of August, 2006

JON W. DUDAS
*Director of the United States Patent and Trademark Office*